US006807042B2

United States Patent
Spampinato et al.

(10) Patent No.: US 6,807,042 B2
(45) Date of Patent: Oct. 19, 2004

(54) INTEGRATED CIRCUIT AND METHOD OF SOFT THERMAL SHUT DOWN FOR POWER DEVICES

(75) Inventors: Sergio Tommaso Spampinato, Catania (IT); Antonino Torres, Palermo (IT)

(73) Assignee: STMicroelectronics S.r.l., Agrate Brianza (IT)

(*) Notice: Subject to any disclaimer, the term of this patent is extended or adjusted under 35 U.S.C. 154(b) by 267 days.

(21) Appl. No.: 10/062,270

(22) Filed: Feb. 1, 2002

(65) Prior Publication Data

US 2002/0144993 A1 Oct. 10, 2002

(30) Foreign Application Priority Data

Feb. 1, 2001 (EP) .............................. 01830066

(51) Int. Cl.[7] .................................. H02H 5/04
(52) U.S. Cl. ..................... 361/103; 361/93.1
(58) Field of Search .................. 361/103, 93.1; 219/494

(56) References Cited

U.S. PATENT DOCUMENTS

| | | | | |
|---|---|---|---|---|
| 3,959,713 A | * | 5/1976 | Davis et al. ............... 323/278 |
| 4,704,654 A | | 11/1987 | Aberle et al. ............... 361/90 |
| 4,972,136 A | * | 11/1990 | Banura ..................... 323/275 |
| 5,430,395 A | | 7/1995 | Ichimaru .................. 327/312 |
| 5,471,498 A | | 11/1995 | Kuo ........................ 375/295 |

OTHER PUBLICATIONS

Patent abstracts of Japan published on Dec. 10, 1993; publication No.: 05328587 entitled "Protector for semiconductor system"; inventor: Shimada Ichiro.

* cited by examiner

Primary Examiner—Stephen W. Jackson
Assistant Examiner—Boris Benenson
(74) Attorney, Agent, or Firm—Lisa K. Jorgenson; Allen, Dyer, Doppelt, Milbrath & Gilchrist, P.A.

(57) ABSTRACT

A thermal control circuit for an integrated power transistor includes a current generator controlled by a turn on signal, a sensing resistance in series with the power transistor, and a current limiter acting when the voltage drop on the sensing resistance overcomes a certain value. The circuit also includes a current amplifier coupled to the output node of the controlled current generator for outputting a drive current that is injected onto a control node of the power transistor. A soft thermal shut down circuit is provided having a conduction state which is enhanced as the temperature increases for reducing the drive current. The circuit controls the voltage on the power transistor in a more effective manner because the current amplifier has a variable gain controlled by the state of conduction of the soft thermal shut down circuit.

31 Claims, 8 Drawing Sheets

INTEGRATED CIRCUIT AND METHOD OF SOFT THERMAL SHUT DOWN FOR POWER DEVICES

FIELD OF THE INVENTION

The present invention relates in general to thermal control circuits, and, more precisely, to circuits for thermally controlling integrated power devices (smart-power devices) such as driving inductive loads.

BACKGROUND OF THE INVENTION

Power stages driving inductive loads require, in certain applications, thermal control for gradually decreasing the current when the temperature increases (soft thermal shut down) and until a steady state condition is reached. At steady state, the power dissipated by the Joule effect equals the rate of heat dissipated in the surroundings.

For example, this kind of thermal control is typically required in integrated power devices employed in electronic ignition systems for engines of motor vehicles. In these applications a soft thermal shut down control circuit avoids the occurrence of an abrupt turning off of the power device in series with the coil upon reaching an abnormally high temperature because of possible anomalous functioning. Generation of sparks at the plugs and undesired detonations are thus prevented.

Figure 1A:
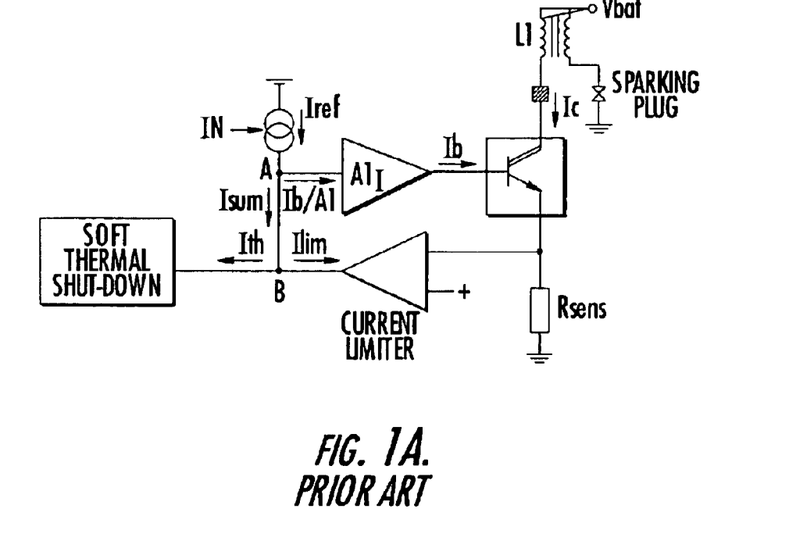

A typical prior art circuit that performs such a function as depicted in FIG. 1A includes functional elements that play a role during an ON phase of the power stage. Instead of a single bipolar transistor, several transistors in a Darlington configuration, or even in a three-stage configuration, if the current absorption by control circuits must be small, may be used.

When a turn on signal "IN" switches from a low logic state to a high logic state, the current generator Iref is enabled. This generator, through a current amplifier $A1_I$ with a constant gain A1, turns on the power stage by forcing a drive current Ib. In these conditions, the collector current Ic of the power stage increases and its variation depends on the value of the inductance of the load and on the supply voltage Vbat.

A current limiter, CURRENT LIMITER, is normally present for limiting the current Ic at a maximum value Icl to ensure the functioning of the device within the allowed temperature range. The current limiter is activated when the voltage drop at the nodes of a sensing resistance RSENS overcomes a certain value and it drains a current Ilim equal to the difference between the current Iref and a replica, scaled by a factor A1, of the driving current Ib that is equal to the ratio between the limitation current Icl at the prescribed working conditions and the gain of the power device. In these conditions, the power stage will work in the direct biasing region of its current characteristic, thus causing strong power dissipation because of the Joule effect.

Figure 1B:
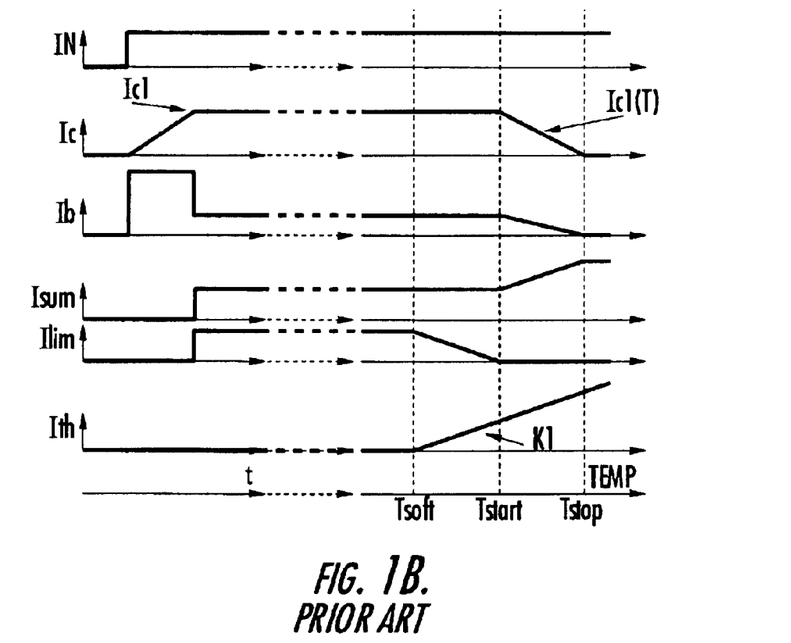

Diagrams of the main signals as a function of the time and of the temperature are also depicted in FIG. 1B, at the left and at the right of the dashed line portion thereof, respectively. Should the turn on signal remain high because of any malfunction, starting a current limitation phase, the power stage will dissipate a far greater power than under nominal working conditions, thus increasing the temperature of the integrated circuit. When a certain pre-established temperature TSOFT is reached, the soft thermal shut down circuit, SOFT THERMAL SHUT DOWN, activates itself and absorbs a current Ith linearly increasing with the temperature with a coefficient K1.

The current variations in each block must satisfy the 1$^{st}$ Kirchhoff's law at node A, that is:

$$\frac{Ib}{A1} = Iref - Isum; \quad Isum = Ilim + Ith; \quad Iref = \text{cost};$$

In the temperature range from TSOFT and TSTART, the current Ith increases of the same amount as Ilim decreases, thus keeping Isum constant, while the current amplifier "$A1_I$" provides the drive current Ib that is necessary to force the required current Ic in the power integrated transistor.

On the contrary, for a temperature T>TSTART an increase of the current Ith implies an increase of Isum with a consequent decrease of the input current of the current amplifier $A1_I$. Therefore, a decrease of the current Ib and thus a decrease of the maximum current Icl that may flow in the power transistor is obtained. As it is possible to note, there is a temperature TSTOP at which the current Icl(T) is zero even if a turn on signal IN at a high logic level is present. As a matter of fact, should the turn on signal be always high, the temperature TSTOP would be never attained. This is so because the circuit will eventually reach a temperature lower than TSTOP, at which point the power dissipated in the circuit equals the rate of heat dissipation in the environment.

The temperature TSTOP should be lower than the maximum junction temperature that may be tolerated by the integrated power transistor and/or be lower than the temperature at which unacceptable variations of the bandgap voltage, customarily used by the circuit as reference voltage, would take place. Preferably the temperature TSTOP is lower than 190° C. and the temperature TSTART, which is prescribed by specifications, is not lower than 150° C.

The difference ΔT=TSTOP−TSTART determines the value of the coefficient K1 of the soft thermal shut down circuit. It is not possible to set a relatively low TSTOP, i.e. close to TSTART, by setting a certain value K1, because of the problem of global stability of the system. In fact, should K1 be too great there would be abrupt variations of Ib with temperature. This would cause a consequent undesired oscillation of the output voltage Vc in proximity of the thermal equilibrium temperature. For this reason the values of K1 should be limited such to establish a TSTOP preferably of about 180° C. to 190° C.

Figure 2A:
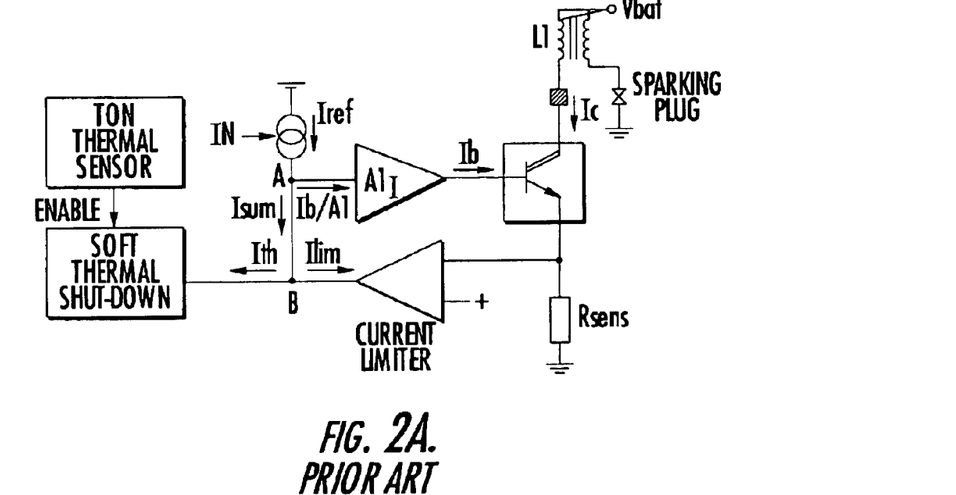
Figure 2B:
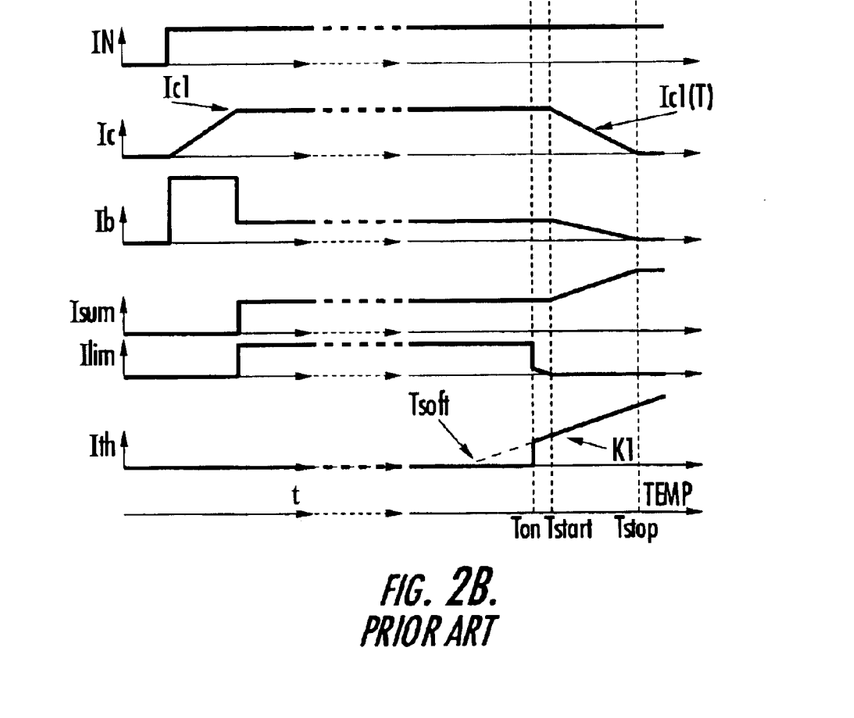

The circuit of FIG. 1A may be improved by using an auxiliary thermal sensor TON THERMAL SENSOR, as depicted in FIG. 2A. Diagrams of the main signals as a function of the time and of the temperature are also depicted in FIG. 2B. The auxiliary thermal sensor enables the soft thermal shut down circuit when a certain temperature TON has been overcome by the integrated circuit. In this way, the soft thermal shut down circuit does not interfere in the normal functioning of the device if the circuit temperature is lower than the activation temperature.

Figure 8:
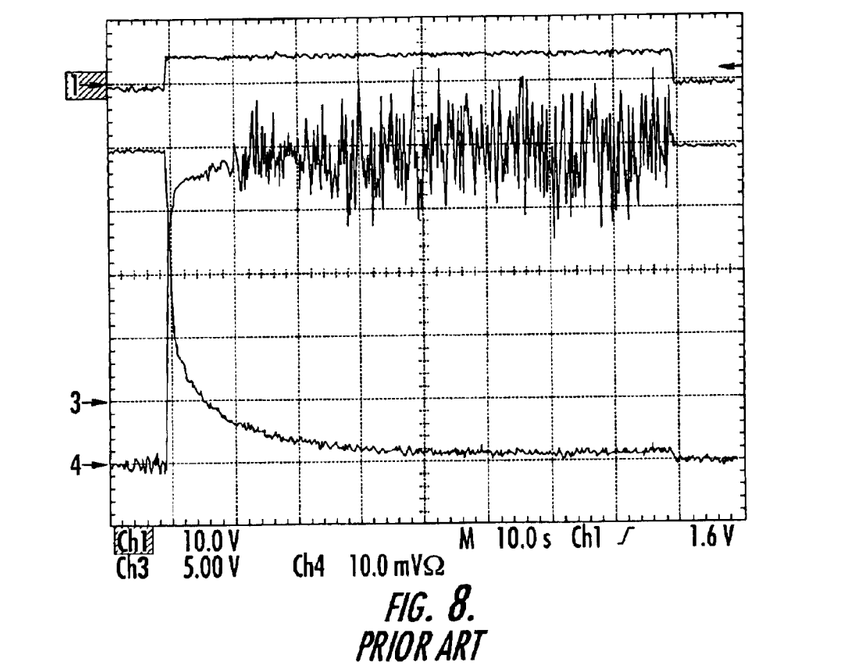
FIG. 8 are traces of results of a simulation of the functioning of the prior art circuit as shown in FIG. 2A.

These well known approaches do not fully address the problem of the instability of Vc. At best, the oscillations of the collector voltage Vc are limited in order to prevent inducing overvoltages that may produce sparks at the plugs in the secondary circuit of the coil. For example, the detected functioning of the commercially available device VB025 of STMicroelectronics, a functional diagram of which is depicted in FIG. 2A, after a turn on pulse IN (Ch1) lasting relatively for a long time (80 seconds), is illustrated in FIG. 8. Evident oscillations of the collector voltage (Ch3) can be noticed, when the collector current (Ch4, 2A/div), that is the current circulating in the primary circuit of the coil, diminishes.

SUMMARY OF THE INVENTION

It has been found and is the object of the present invention to provide a thermal control circuit and a related method of soft thermal shut down of an integrated power transistor that reduces the amplitude of the oscillations of the collector voltage of the power transistor. This is obtained by employing a current amplifier $A1(T)_I$ having a variable gain that is controlled by the SOFT THERMAL SHUT DOWN circuit. The invention is directed to reducing the gain of the amplifier when the temperature increases, instead of reducing the current provided to the amplifier through the soft thermal shut down circuit, as in the known devices. In this manner, the value of Ib is reduced, but differently from the circuit of the prior art. At the same time also its oscillations, due for example to the input noise of the amplifier, are reduced.

More precisely, the thermal control circuit is for an integrated power transistor and comprises a current generator controlled by a turn on signal, a sensing resistance in series with the power transistor, a current limiter enabled when the voltage drop at the nodes of the sensing resistance overcomes a certain value, and a current amplifier coupled to the output node of the controlled current generator producing a drive current that is injected on the control node of the power transistor. The thermal control circuit may also include a soft thermal shut down circuit whose state of conduction increases as the temperature increases thereby progressively reducing the drive current of the power transistor.

The circuit of the invention controls the voltage on the power transistor in a significantly more effective manner than the known circuits because the current amplifier has a gain that varies as a function of the state of conduction of the soft thermal shut down circuit, and, therefore, as a function of the temperature.

A further object of the invention is to provide a method of soft thermal shut down of a power transistor that allows a reduction of the oscillations of the collector voltage. This method, implemented with a thermal control circuit of the invention, substantially includes reducing progressively the gain of the drive current amplifier as the temperature increases until a thermal equilibrium is reached.

BRIEF DESCRIPTION OF THE DRAWINGS

The different aspects and advantages of the invention will appear even more evident through a detailed description of several embodiments and by referring to the attached drawings in which:

FIGS. 1A to 2B are known thermal control circuits of a power transistor, as in the prior art;

FIGS. 3A to 4B are two possible embodiments of the circuit of the invention;

DETAILED DESCRIPTION OF THE PREFERRED EMBODIMENTS

The thermal control circuit of the invention differs from known circuits by employing a current amplifier whose gain varies in function of the temperature. This effectively compensates for the fact that oscillations of the output voltage Vc are principally due to the variations on temperature of the drive current of the power device Ib upon the changing of the temperature when the output current Ic is relatively small because of the intervention of the soft thermal shut down circuit, SOFT THERMAL SHUT DOWN. Such generally large oscillations are effectively attenuated by employing a drive current amplifier whose gain becomes smaller upon the raising of the temperature at higher temperatures.

Figure 3A:
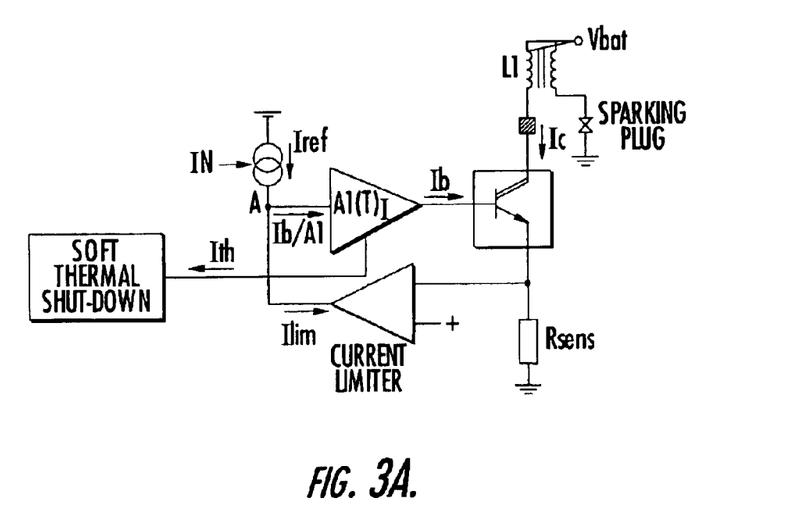
Figure 3B:
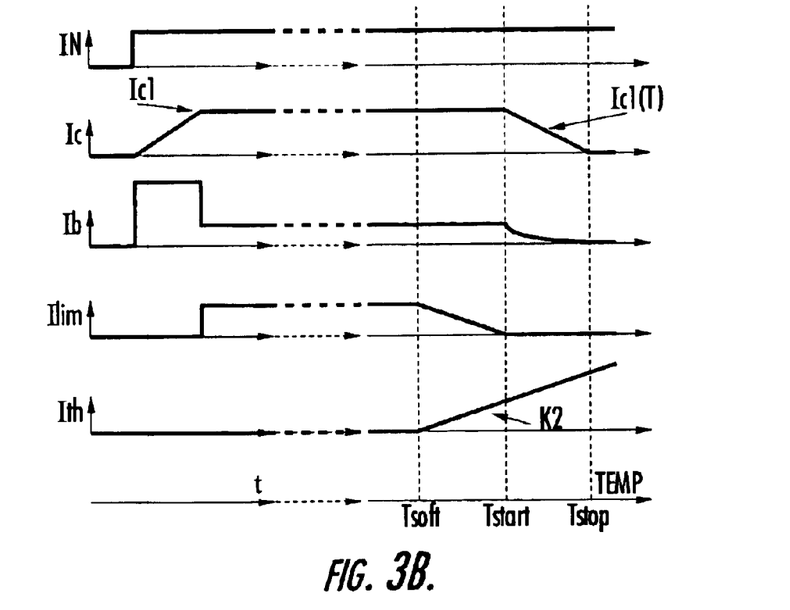
Figure 4A:
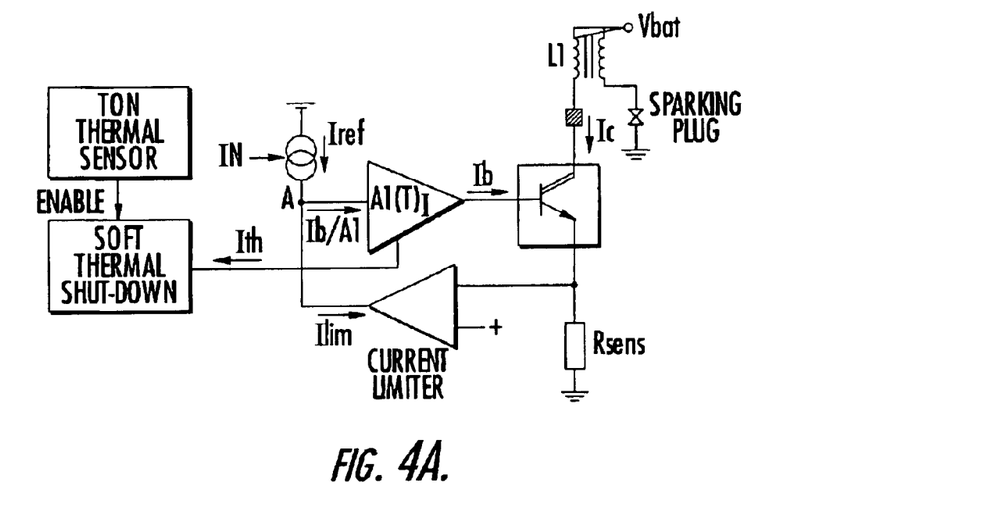

The diagrams of two different embodiments of the circuit of the invention are depicted in FIGS. 3A and 4A. As understood with additional reference to the diagrams of FIGS. 3B and 4B, the variation of Ib is not linear in the temperature range between $T_{START}$ and $T_{STOP}$, as for the prior art circuits of FIGS. 1A and 2A. Instead, the current decreases exponentially. Therefore, there is a rapid reduction of Ib and thus a rapid reduction of the current flowing in the power transistor. Such a characteristic is due to the fact that the gain substantially decreases as does the current Ic, and thus as much as the current Ib does. In fact the gain of the current amplifier is relatively high at low temperatures, that is, at the turn on of the power transistor when the current Ic is large. The gain progressively drops as the temperature increases, and while the transistor attains its steady state temperature and is crossed by a smaller current Ic.

Figure 4B:
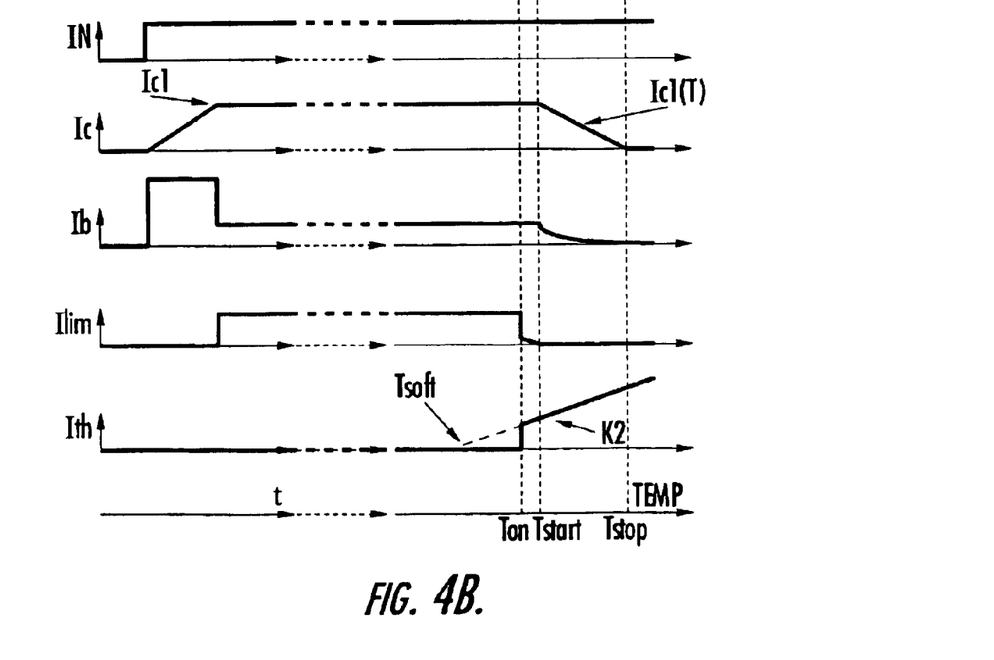

The diagrams of FIGS. 3B and 4B, as well as those of FIGS. 1B and 2B, actually show in a simplified manner the true signals. In particular the variation of Ic(T) between the temperatures $T_{START}$ and $T_{STOP}$ is depicted as being linear for sake of simplicity, but in general it is not linear because of the variation of the gain HFE=Ic/Ib of the power stage in function of the current Ib.

By comparing the circuit of FIGS. 3A and 3B to the circuit of FIGS. 1A and 1B (or, similarly, the circuit of FIGS. 4A and 4B to the circuit of FIGS. 1A and 1B), it may be noted that the thermal coefficient K2 of Ith of the soft thermal shut down circuit is different from that of FIGS. 1A and 1B. Because of the particular embodiment of the block $A1(T)_I$, it is possible to have larger coefficients K2 than in the known prior art circuits. Therefore, it is possible to obtain a lower temperature difference $\Delta T = T_{STOP} - T_{START}$ than the corresponding temperature difference of the prior art circuits without being affected by the above mentioned problems of instability of the output voltage Vc.

Figure 5:
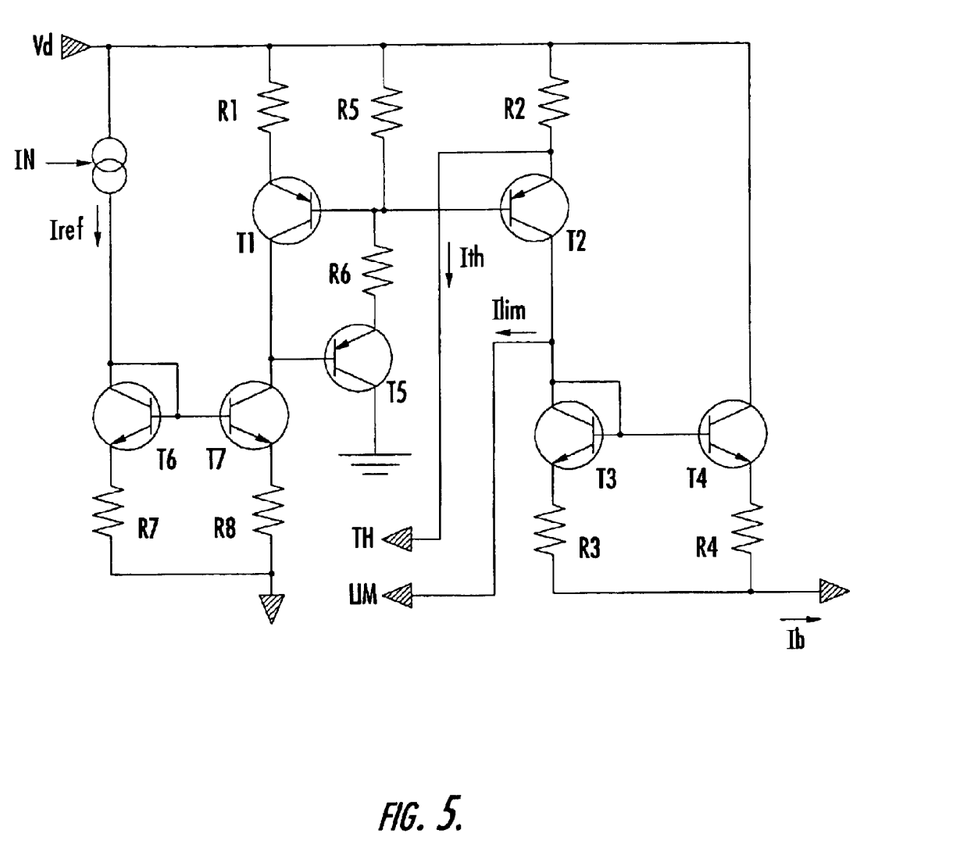
FIG. 5 is a schematic diagram of an embodiment of the variable gain amplifier of the circuits of FIGS. 3A to 4B.

A preferred embodiment of the controlled gain current amplifier $A1(T)_I$ is depicted in FIG. 5. The shown amplifier is realized with BJTs, but it may alternatively be realized with MOS transistors instead of BJTs, as well as in an alternate form with transistors having a conductivity of opposite kind to that shown in the figure. The amplifier includes a plurality of stages. The first stage is a current mirror comprising transistors T6, T7 and emitter resistances R7, R8. Of course, this stage may be omitted if the current generator Iref, driven by the turn on signal IN, is coupled to ground instead of to the supply voltage.

The second stage is provided by another current mirror, preferably with recovery of the base current realized by the transistors T1, T2, T5 and having emitter degeneration resistances R1, R2. Finally a third emitter degenerated output current mirror is provided by transistors T3, T4 and degeneration resistances R3 and R4.

As it is well known, components R5, R6 and T5 serve only to improve the precision of the current mirror provided by transistors T1, T2. By straightforward calculations one may find that the value of the collector current circulating in trans T2 is given by the following formula:

$$Ic_{(T2)} = \frac{1}{R_2} \cdot \left[ Iref \cdot R_1 + V_T \cdot \ln\left(\frac{A_2}{A_1}\right) \cdot \left(\frac{Iref}{Ic_{(T2)}}\right) \right] \quad (1)$$

(valid for $Ith = 0$)

where A1 and A2 are the respective areas of transistors T1 and T2, and $V_T$ is the thermal voltage. Generally the amplifier is realized such to make the first term, between the square brackets, much greater than the second term, thus rendering the latter negligible and the ratio between the currents Ic(T2) and Iref dependent only from the ratio of the resistances R1 and R2:

$$Ic_{(T2)} \approx \frac{R_1}{R_2} \cdot Iref \quad (2)$$

(valid for $Ith = 0$)

The current mirror provided by transistors T1, T2 does not necessarily need base current recovery, thus eliminating devices R5, R6 and T5 and connecting the bases of transistors T1 and T2 to the collector of transistor T1. The opposite is true for the third current mirror. It may be a current mirror with base current recovery or, for sake of simplicity, even without emitter degeneration resistances R3 and R4. In this last case, the collector current of transistor T4 is amplified with respect to the collector current of transistor T3 not according to a function (1), but according to a different function as it well known in the art. Whichever may be the configuration of the variable gain amplifier, the resistances R1 and R2 must be present for reducing the amplification ratio of the current mirror provided by transistors T1, T2, simply by forcing a current Ith, that increases with temperature, through the soft thermal shut down circuit.

Figure 6:
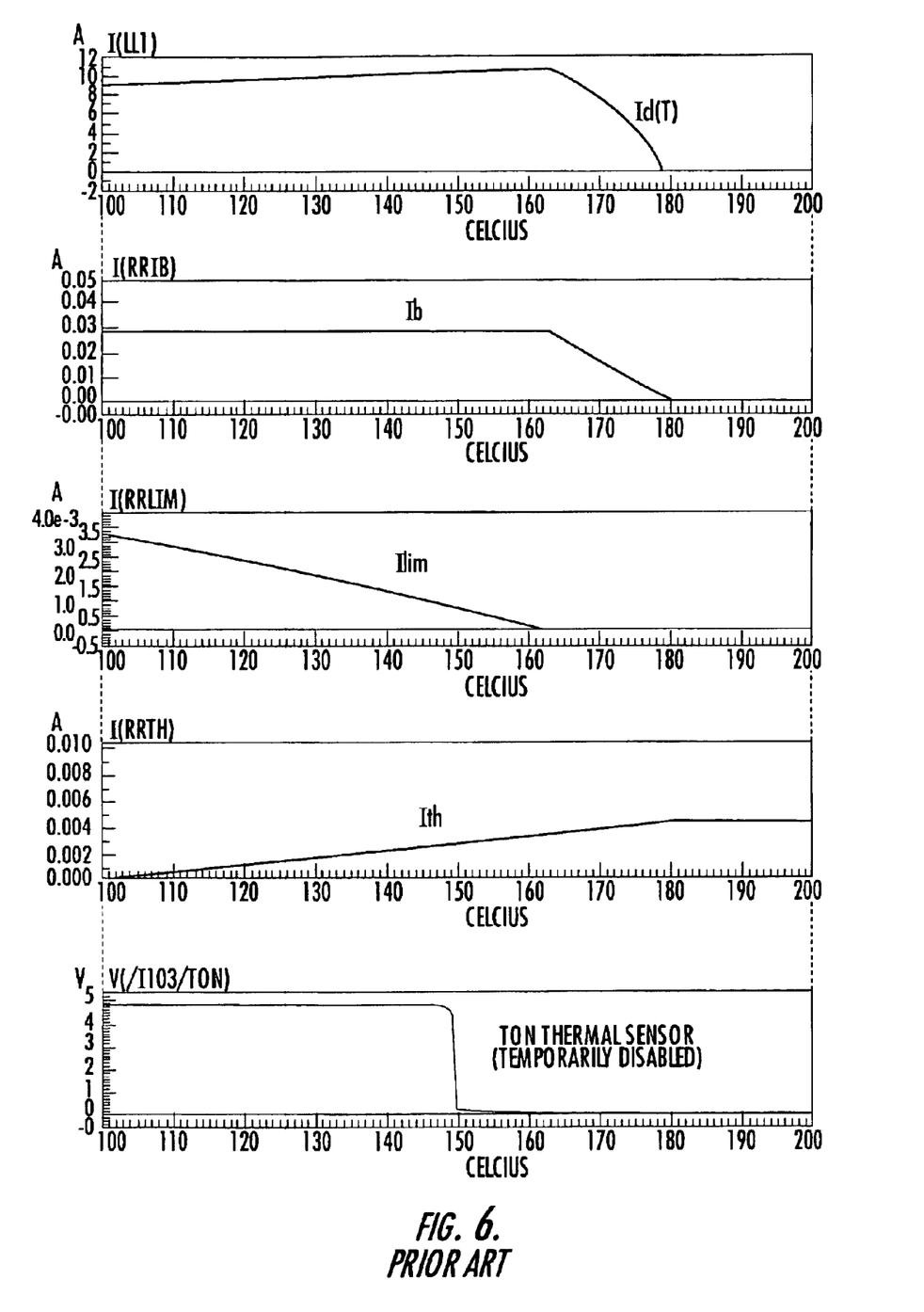
FIG. 6 is a graph of plots of the main signals of the prior art circuit as shown in FIG. 1.
Figure 7:
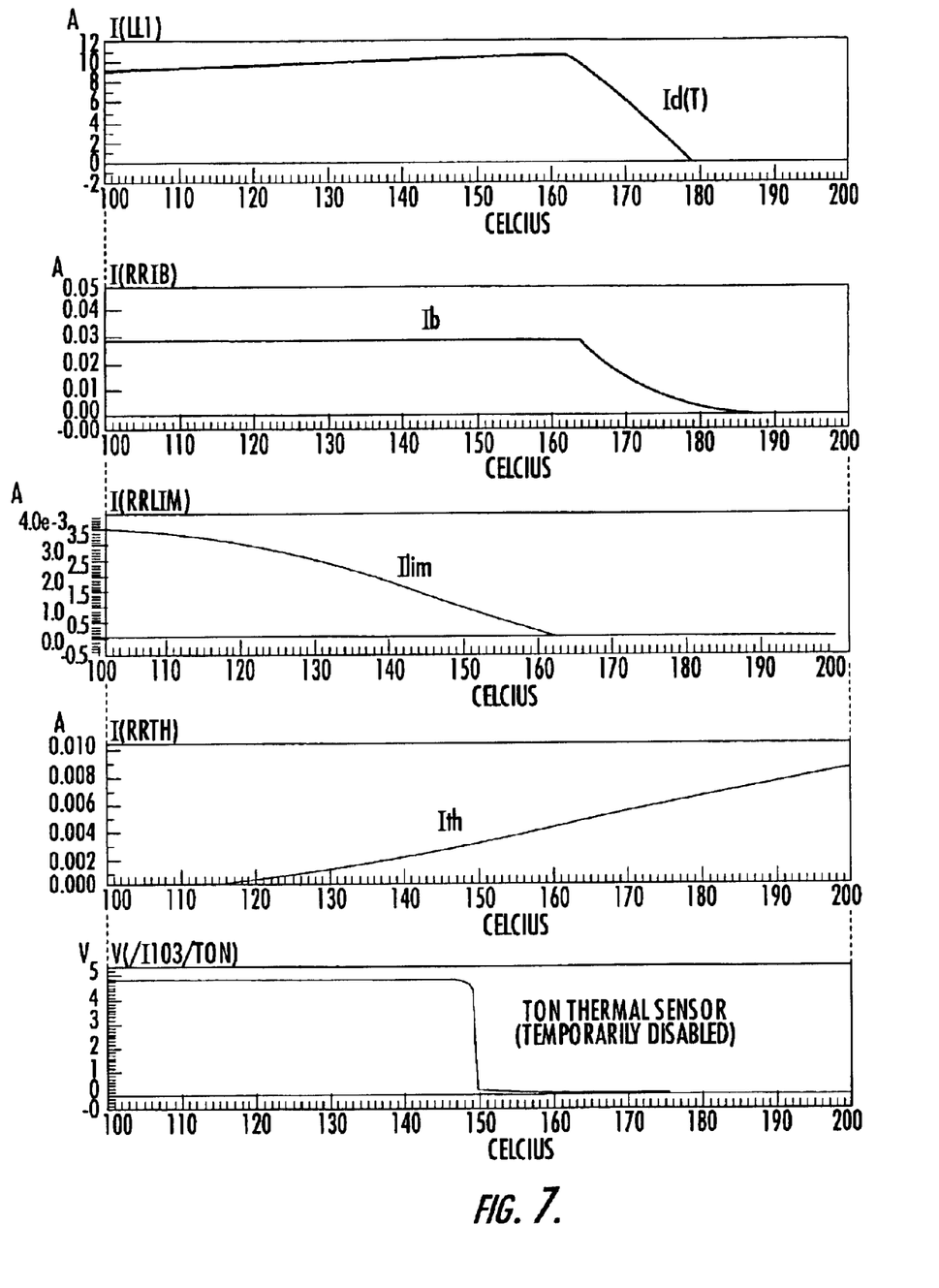
FIG. 7 is a graph of plots of the main signals of the circuit of the invention as shown in FIG. 3.

The difference between the invention and the prior art approaches may be appreciated from examining the comparative simulations of FIGS. 6 and 7. The simulation of a prior art circuit is shown in FIG. 6, while a comparable simulation carried out after appropriate assignation of the values of the components of the current of the invention of FIG. 5, is shown in FIG. 7. In both simulations the thermal sensor TON THERMAL SENSOR, which normally switches at 150° C., was disabled in order to show the behavior under the general conditions of FIGS. 1A, 1B, 3A and 3B. By enabling the sensor, there are instantaneous variations of Ith and Ilim starting from the temperature TON, as highlighted by the curves of FIGS. 2B and 4B.

The circuit of the invention of FIG. 4A was tested for verifying the performance improvements obtained, given that it was not possible to perform a transient simulation with relative temperature variation caused by thermal dissipation. Such a circuit was obtained by modifying the scheme of the connections of the known circuit of FIG. 2A and using the current amplifier of FIG. 5.

Figure 9:
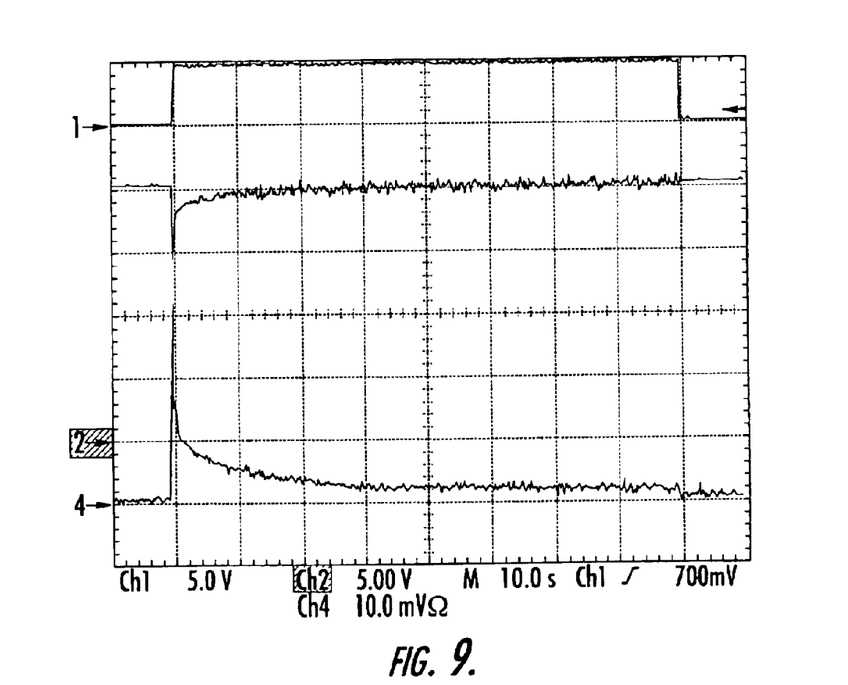
FIG. 9 are traces of results of a simulation of the functioning of the circuit of the invention as shown in FIG. 4.

The experimental diagrams, depicted in FIG. 9, were obtained under the same test conditions that produced the results depicted in FIG. 8. As it may noticed, after the switching of the turn on signal IN (Ch1), there is a brief transient during which the collector current Ic (Ch4) diminishes, while the collector voltage (Ch2) reaches the steady state value. The comparison between the two figures shows clearly how, using the circuit of the invention, the collector voltage of the power transistor undergoes oscillations that are much smaller than the oscillations that occur in the prior art circuits.

That which is claimed is:

1. A thermal control circuit for a power transistor, the power transistor having a control node, the thermal control circuit comprising:
   a current generator controlled by a turn on signal and having an output node producing a bias current;
   a sensing resistance in series with the power transistor;
   a current limiter acting when a voltage drop on the sensing resistance exceeds a threshold;
   a current amplifier connected to the output node of said current generator for outputting a drive current to the control node of the power transistor; and
   a soft thermal shut down circuit having a state of conduction being enhanced as a temperature increases for reducing drive current for the power transistor;
   said current amplifier having a gain varying as a function of the state of conduction of said soft thermal shut down circuit.

2. The thermal control circuit according to claim 1, wherein said current amplifier comprises a multistage amplifier including an output stage having a signal node; and wherein said soft thermal shut down circuit is connected to the signal node of the output stage and drains a current therefrom as a function of its state of conduction.

3. The thermal control circuit according to claim 1, wherein said current amplifier comprises a first current mirror of first conductivity type including emitter degeneration resistances passing current based upon the bias current of said current generator and an output transistor having conduction nodes coupled respectively to said soft thermal shut down circuit and to said current limiter.

4. The thermal control circuit according to claim 3, wherein said current amplifier further comprises an output current mirror connected in cascade with said first current mirror and having a conductivity of opposite type, said current amplifier comprising a plurality of transistors outputting the drive current as a sum of currents therein.

5. The thermal control circuit according to claim 4, wherein said current amplifier further comprises an input current mirror having a second conductivity type and producing a scaled replica of the bias current.

6. The thermal control circuit according to claim 3, wherein said first current mirror has bias current recovery.

7. The thermal control circuit according to claim 5, wherein said output current mirror and said input current mirror comprise respective emitter degeneration resistances.

8. The thermal control circuit according to claim 1, wherein said current amplifier comprises a plurality of bipolar transistors.

9. The thermal control circuit according to claim 1, further comprising a thermal sensor producing a signal for enabling said soft thermal shut down circuit when the temperature is greater than a predetermined temperature and producing a signal for disabling said soft thermal shut down circuit when the temperature is lower than the predetermined temperature.

10. The thermal control circuit according to claim 9, wherein the predetermined temperature is not lower than 150° C.

11. The thermal control circuit according to claim 1, wherein said soft thermal shut down circuit drains a current such as to nullify the gain of said current amplifier at a temperature not greater than 190° C.

12. A thermal control circuit for a power transistor, the power transistor having a control node, the thermal control circuit comprising:

a current generator having an output node producing a bias current;

a current amplifier connected to the output node of said current generator for outputting a drive current to the control node of the power transistor; and a soft thermal shut down circuit having a state of conduction being enhanced as a temperature increases for reducing drive current for the power transistor;

said current amplifier having a gain varying as a function of the state of conduction of said soft thermal shut down circuit.

13. The thermal control circuit according to claim 12, further comprising a sensing resistance in series with the power transistor, and a current limiter acting when a voltage drop on the sensing resistance exceeds a threshold.

14. The thermal control circuit according to claim 12, wherein said current amplifier comprises a multistage amplifier including an output stage having a signal node; and wherein said soft thermal shut down circuit is connected to the signal node of the output stage and drains a current therefrom as a function of its state of conduction.

15. The thermal control circuit according to claim 14, wherein said current amplifier comprises a first current mirror of a first conductivity type including emitter degeneration resistances passing current based upon the bias current of said current generator and an output transistor having conduction nodes coupled respectively to said soft thermal shut down circuit and to said current limiter.

16. The thermal control circuit according to claim 15, wherein said current amplifier further comprises an output current mirror connected in cascade with said first current mirror and having a conductivity of opposite type, said current amplifier comprising a plurality of transistors outputting the drive current as a sum of currents therein.

17. The thermal control circuit according to claim 16, wherein said current amplifier further comprises an input current mirror having a second conductivity type and producing a scaled replica of the bias current.

18. The thermal control circuit according to claim 17, wherein said output current mirror and said input current mirror comprise respective emitter degeneration resistances.

19. The thermal control circuit according to claim 12, further comprising a thermal sensor producing a signal for enabling said soft thermal shut down circuit when the temperature is greater than a predetermined temperature and producing a signal for disabling said soft thermal shut down circuit when the temperature is lower than the predetermined temperature.

20. An integrated circuit comprising:

a power transistor and a thermal control circuit connected thereto, said power transistor having a control node, said thermal control circuit comprising a current generator having an output node producing a bias current, a current amplifier connected to the output node of said current generator for outputting a drive current to the control node of the power transistor, and a soft thermal shut down circuit having a state of conduction being enhanced as a temperature increases for reducing drive current for the power transistor, said current amplifier having a gain varying as a function of the state of conduction of said soft thermal shut down circuit.

21. The integrated circuit according to claim 20, further comprising a sensing resistance in series with the power transistor, and a current limiter acting when a voltage drop on the sensing resistance exceeds a threshold.

22. The integrated circuit according to claim 20, wherein said current amplifier comprises a multistage amplifier including an output stage having a signal node; and wherein said soft thermal shut down circuit is connected to the signal node of the output stage and drains a current therefrom as a function of its state of conduction.

23. The integrated circuit according to claim 20, wherein said current amplifier comprises a first current mirror of a first conductivity type including emitter degeneration resistances passing current based upon the bias current of said current generator and an output transistor having conduction nodes coupled respectively to said soft thermal shut down circuit and to said current limiter.

24. The integrated circuit according to claim 23, wherein said current amplifier further comprises an output current mirror connected in cascade with said first current mirror and having a conductivity of opposite type, said current amplifier comprising a plurality of transistors outputting the drive current as a sum of currents therein.

25. The integrated circuit according to claim 24, wherein said current amplifier further comprises an input current mirror having the opposite kind of conductivity and producing a scaled replica of the biasing current.

26. The integrated circuit according to claim 25, wherein said output current mirror and said input current mirror comprise respective emitter degeneration resistances.

27. The thermal control circuit according to claim 20, further comprising a thermal sensor producing a signal for enabling said soft thermal shut down circuit when the temperature is greater than a predetermined temperature and producing a signal for disabling said soft thermal shut down circuit when the temperature is lower than the predetermined temperature.

28. A method of operating a thermal control circuit connected to a power transistor and comprising a current generator producing a bias current, a current amplifier connected to the current generator for outputting a drive current to the power transistor, and a soft thermal shut down circuit having a state of conduction being enhanced as a temperature increases for reducing drive current for the power transistor, the method comprising:

varying a gain of the current amplifier as a function of the state of conduction of the soft thermal protection circuit.

29. The method according to claim 28, wherein the thermal control circuit further comprises a sensing resistance in series with the power transistor; and further comprising limiting current when a voltage drop on the sensing resistance exceeds a threshold.

30. The method according to claim 28, wherein the current amplifier further comprises an output stage; and wherein varying the gain comprises attenuating a signal level in the output stage of the current amplifier by draining a current through the soft thermal shut down circuit.

31. The method according to claim 28, further comprising keeping disabled the soft thermal shut down circuit as long as a temperature does not exceed a predetermined value.

* * * * *